United States Patent
Kojima et al.

(10) Patent No.: US 7,451,025 B2
(45) Date of Patent: Nov. 11, 2008

(54) TEST MODE CIRCUIT AND RESET CONTROL METHOD THEREFOR

(75) Inventors: Akio Kojima, Anjo (JP); Nobutomo Takagi, Okazaki (JP)

(73) Assignee: Denso Corporation, Kariya (JP)

( * ) Notice: Subject to any disclaimer, the term of this patent is extended or adjusted under 35 U.S.C. 154(b) by 153 days.

(21) Appl. No.: 11/288,170

(22) Filed: Nov. 29, 2005

(65) Prior Publication Data

US 2006/0156109 A1    Jul. 13, 2006

(30) Foreign Application Priority Data

Dec. 3, 2004  (JP)  ............... 2004-351184

(51) Int. Cl.
*G01R 31/28* (2006.01)
(52) U.S. Cl. ............. 701/29; 714/734; 323/282; 323/351; 324/426; 324/527
(58) Field of Classification Search ............. 714/724, 714/734; 323/282, 283, 351; 324/429, 433, 324/426, 527, 763, 771
See application file for complete search history.

(56) References Cited

U.S. PATENT DOCUMENTS

| | | | | |
|---|---|---|---|---|
| 4,449,100 A * | 5/1984 | Johnson et al. | ............. | 324/378 |
| 4,615,318 A * | 10/1986 | Imoto et al. | ............. | 123/612 |
| 4,667,176 A * | 5/1987 | Matsuda | ............. | 340/459 |
| 4,749,873 A * | 6/1988 | Mutoh et al. | ............. | 307/10.2 |
| 5,304,979 A * | 4/1994 | Lima et al. | ............. | 340/428 |
| 5,726,573 A * | 3/1998 | Chen et al. | ............. | 324/429 |
| 6,236,219 B1 * | 5/2001 | Morgan | ............. | 324/550 |
| 6,240,534 B1 * | 5/2001 | Nakane | ............. | 714/55 |
| 6,400,195 B1 * | 6/2002 | Bhaskaran | ............. | 327/142 |
| 6,526,536 B1 * | 2/2003 | Chen et al. | ............. | 714/738 |
| 7,023,731 B2 * | 4/2006 | Hamaguchi et al. | ............. | 365/185.14 |
| 2003/0141873 A1 * | 7/2003 | Bolz | ............. | 324/380 |
| 2003/0151313 A1 * | 8/2003 | Nakanishi | ............. | 307/139 |
| 2004/0095164 A1 * | 5/2004 | Kernahan et al. | ............. | 327/94 |
| 2004/0095179 A1 * | 5/2004 | Eliason | ............. | 327/217 |
| 2004/0122565 A1 * | 6/2004 | Sakurai et al. | ............. | 701/1 |

(Continued)

FOREIGN PATENT DOCUMENTS

JP    A-5-34419    2/1993

(Continued)

OTHER PUBLICATIONS

Dufaza, C., IHS, H, "Test synthesis for DC test and maximal diagnosis of swtiched-capacitor circuits",☐☐VLSI Test Symposium, 1997, 15th IEEE, Apr. 27-May 1, 1997 pp. 252-260 ☐☐.*

(Continued)

*Primary Examiner*—Tuan C To
(74) *Attorney, Agent, or Firm*—Posz Law Group, PLC

(57) ABSTRACT

A power control circuit is provided in a vehicle control ECU mounted in a vehicle. The control circuit, when making a shift to a test mode by a test mode circuit, closes a relay to supply a power voltage from a battery to a power line in the similar manner as an ignition main switch is turned on. A logic circuit section of the test mode circuit is reset by an OR logic of a set level of a test terminal and a level of the power line.

10 Claims, 3 Drawing Sheets

U.S. PATENT DOCUMENTS

2005/0062523 A1* 3/2005 Wang et al. .................. 327/554
2006/0041768 A1* 2/2006 Weber et al. ................. 713/323

FOREIGN PATENT DOCUMENTS

| JP | A-8-161001 | | 6/1996 |
|----|------------|---|--------|
| JP | 10307167 A | * | 11/1998 |
| JP | 11352195 A | * | 12/1999 |

OTHER PUBLICATIONS

Renovell, M., Azias, F., Bodin, J.C., Bertrand, Y, "Design-for-testability for switched-current circuits", VLSI Test Symposium, 1998. Proceedings. 16th IEEE, Apr. 26-30, 1998 pp. 370-375 □□.*

* cited by examiner

US 7,451,025 B2

TEST MODE CIRCUIT AND RESET CONTROL METHOD THEREFOR

CROSS REFERENCE TO RELATED APPLICATION

This application is based on and incorporates herein by reference Japanese patent application No. 2004-351184 filed on Dec. 3, 2004.

FIELD OF THE INVENTION

The present invention relates to a test mode circuit and a reset control method therefor. The test mode circuit is built in a control circuit in the form of an integrated circuit (IC) that supplies a voltage signal supplied from an external section to other circuit sections when an external operation switch is turned on, and drives the control circuit to a test mode.

BACKGROUND OF THE INVENTION

Recent control circuits are integrated and have many functions by combining analog circuit sections and digital circuit sections or by increasing digital circuit sections. To facilitate easy confirmation of functions of the digital circuit sections, that is, to improve a test coverage or testability, the control circuits are configured to operate in a test mode to perform function tests. Each control circuit mounted in a vehicle, however, is subjected to very harsh operating conditions. As a result, when the control circuit is erroneously switched to the test mode due to mechanical causes such as vibrations or electric noises during a travel of the vehicle, the control circuit is disabled to operate properly.

Further, even when a vehicle is at rest, the control circuit should be protected from being erroneously switched to the test mode so that the dark current of the control circuit may be reduced or erroneous operation of a system may be prevented. When it is erroneously switched to the test mode, a fail safe operation is needed to switch it back to a normal mode.

In JP-8-161001A for instance, therefore, a test mode operation check signal is stored in a nonvolatile memory, and the test mode is executed only when a key operation for a test mode operation is made under the condition that the check signal indicates permission of the test mode operation.

It however requires an additional work of storing the check signal in the nonvolatile memory each time. It is possible only in the case that the nonvolatile memory is rewritable from an external side. Further, it is still likely that a control circuit is erroneously switched to the test mode even if the check signal is stored.

SUMMARY OF THE INVENTION

It is therefore an object of the present invention to provide a test mode circuit and a reset control method therefor, which is capable of canceling a test mode even when a control circuit is erroneously switched to the test mode.

According to the present invention, a test mode circuit is provided in a control circuit, which supplies a voltage signal applied from an external side to other circuit sections by turning on an ON/OFF switch provided in a voltage signal line when an external operation switch is turned on. In the test mode circuit, a test mode is set so that the ON/OFF switch is turned on to cause the control circuit to make a shift to a test mode. A logic circuit section is rest, when the ON/OFF switch is turned on in response to a turn-on of the external operation switch.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EMBODIMENT

Figure 1:
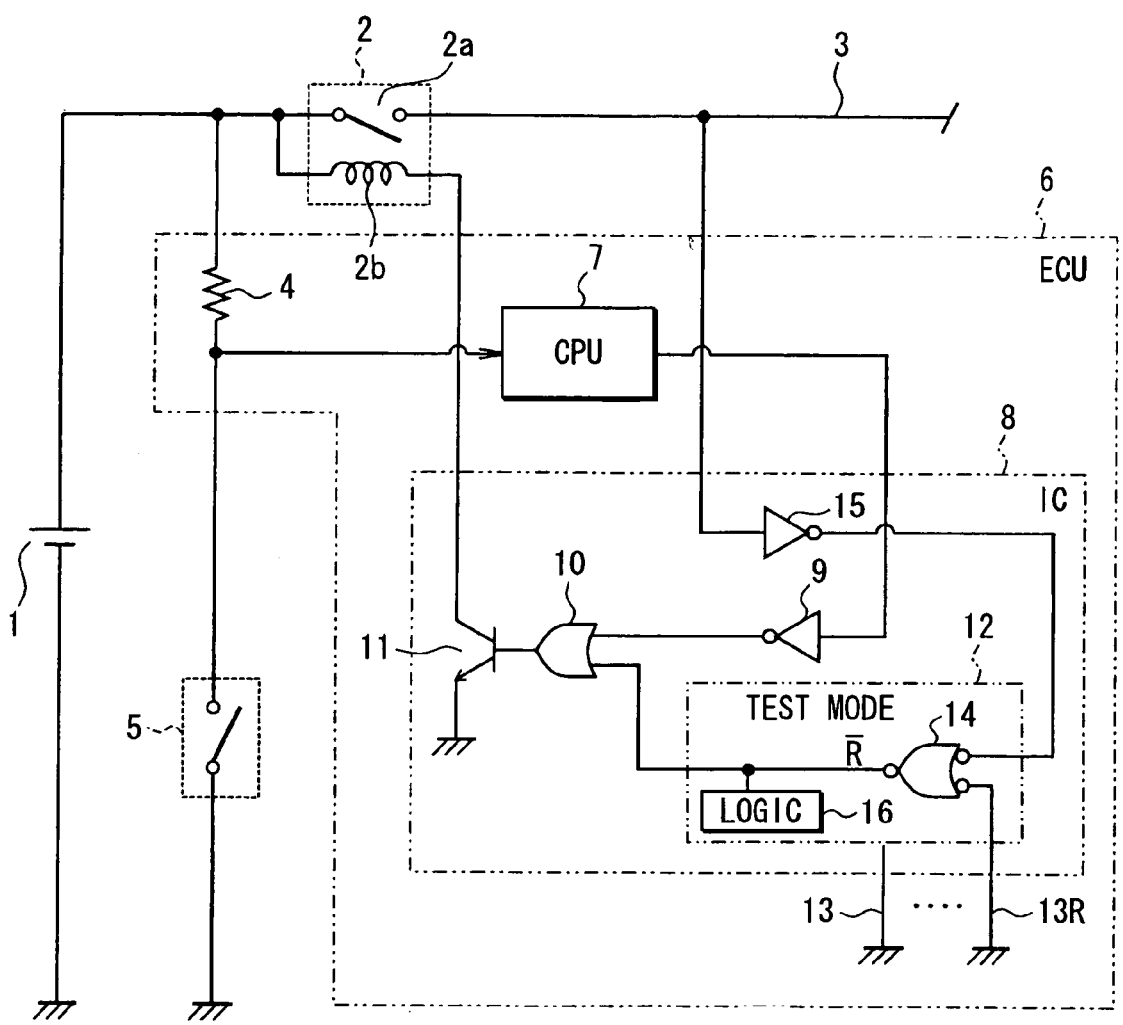
FIG. 1 is a circuit diagram showing an embodiment of the present invention applied to a power control circuit provided in a vehicle control ECU.

Referring to FIG. 1, a power control circuit 8 in the form of an integrated circuit (IC) is provided in an electronic control unit (ECU) 6 of a vehicle. The ECU 6 is connected to a storage battery 1, an ignition (IG) relay 2 and an ignition main switch 5 operating as an external switch. The positive terminal of the battery 1 is connected to a power line (voltage signal line) 3 through a normally-open switch (ON/OFF switch) 2a of the IG relay 2. It is also connected to the ground through a resistor 4 and the IG main switch 5.

The junction between the resistor 4 and the IG main switch 5 is connected to an input terminal of a central processing unit (CPU) 7, which is a main part of the ECU 6. The CPU 7 outputs a logic signal to a NOT gate (inverter) 9 of the control circuit 8 in response to changes in the voltage level at its input terminal.

Although not shown, the ECU 6 is continuously supplied with a regulated power generated from the power of the battery 1 irrespective of ON/OFF conditions of the IG main switch 5. The CPU 7 produces a high level signal to the NOT gate 9 based on a high level voltage (battery voltage +B) at its input terminal, when the IG main switch 5 is turned off. It produces a low level signal to the NOT gate 9 based on a change from the high level voltage to a low level voltage at its input terminal, when the IG main switch 5 is turned on. The CPU 7 further produces low level signals to other circuit sections in the ECU 6, when necessary, based on changes in the voltage level at its input terminal (i.e., ON/OFF of the IG main switch 5).

The NOT gate 9 is connected to the base of an NPN transistor 11 through an OR gate 10. The collector and the emitter of the transistor 11 are connected to the positive terminal of the battery 1 through a coil 2b of the relay 2 and to the ground, respectively. A test mode circuit 12 is provided in the control circuit 8 to switch the operation mode of the control circuit 8 to a normal mode or a test mode based on signal levels set at a plurality of test terminals (external terminals) 13. The test mode circuit 12 is also connected to the OR gate 10 as the NOT gate 9 is.

A test terminal 13R among the test terminals 13 is for resetting a logic circuit section 16 such as a flip-flop (not shown), which produces a test mode signal, to a low active state. The test terminal 13R is connected to one input terminal of a NOT-logic OR gate 14. The OR gate 14 operates as a reset circuit and produces a reset signal for the logic circuit section 16.

The types of test mode is determined based on signal levels set at the test terminals 13 other than one test terminal 13R. When the test terminal 13R is at the high level, a test mode signal is applied to the control circuit 8, which responsively operates in a preset test mode. Specifically, although not shown, the control circuit 8 is constructed to switch signal transmission paths and the like in correspondence to different test modes. When the test terminal 13R is at the low level, the logic circuit section 16 of the test mode circuit 12 is reset through the OR gate 14 so that the control circuit 8 operates in the normal mode.

When the test mode circuit 12 is in the reset-released condition and in any one of the test modes, it sets a test mode output signal applied to the OR gate 10 to the high level. That is, during the ECU 6 is operating in the normal mode, the signal level at the input terminal of the NOT gate 9 is changed from the high level to the low level through the CPU 7 when the IG main switch 5 is turned on. As a result, the transistor 11 is turned on, and the coil 2b is energized to close the switch 2a. The power from the battery 1 is supplied to the power line 3, through which the battery voltage is supplied to vehicle control ECUs other than the ECU 6.

When the test mode circuit 12 sets the test mode, it changes the test mode output to the high level even if the IG main switch 5 is not turned on. As a result, the transistor 11 is turned on so that the power of the battery 1 is supplied to the power line 3.

The power line 3 is connected to the NOT-logic OR gate 14 through the NOT gate 15. Therefore, when the switch 2a of the ignition relay 2 is closed to supply the power voltage of the battery 1 to the power line 3, the output level of the NOT gate 15 changes from the low level to the high level. As a result, the logic circuit section 16 of the test mode circuit 12 is reset through the OR gate 14.

Figure 2:
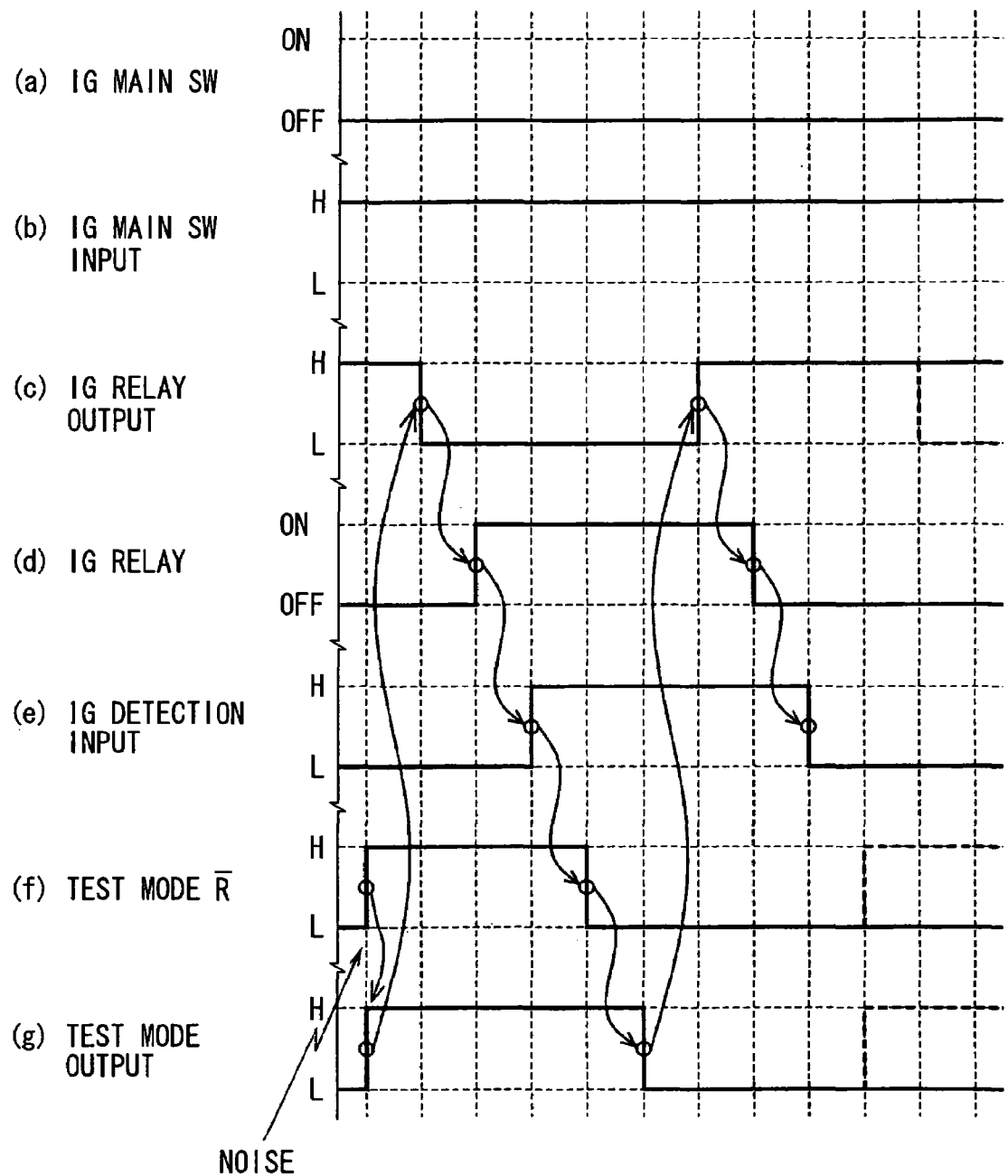
FIG. 2 is a timing diagram of operations of the embodiment in a case that a vehicle is at rest.
Figure 3:
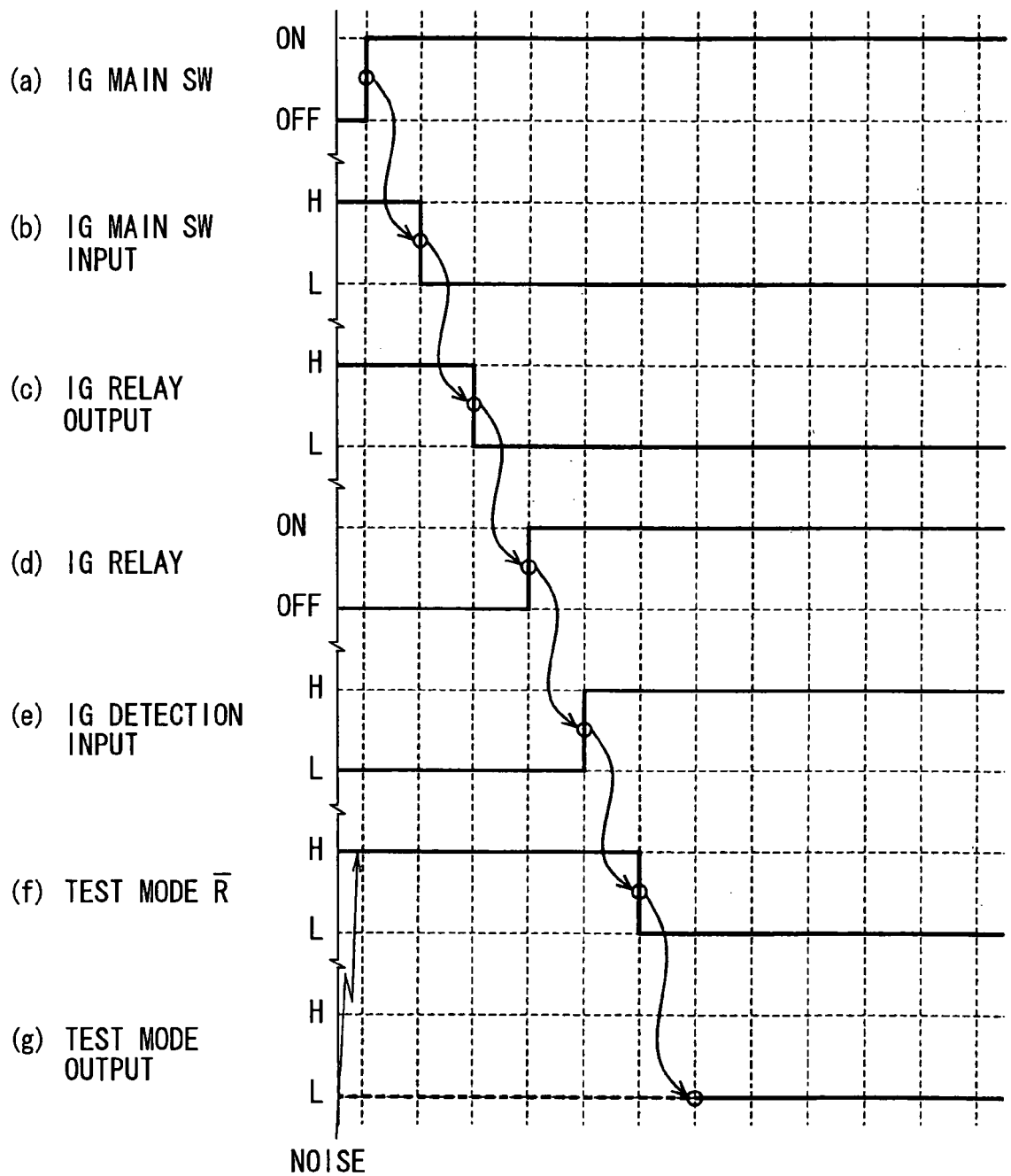
FIG. 3 is a timing diagram of operations of the embodiment in a case that the vehicle is in operation with its ignition main switch being turned on and an engine is started.

The embodiment operates as shown in FIGS. 2 and 3. In the case that the control circuit 8 is provided in the ECU 6 to be used actually in vehicle control, the control circuit 8 need not be operated in the test mode. Therefore it is a general practice that all the test terminals 13 are grounded to the circuit ground of the ECU 6 so that the test mode output logic in the test mode circuit 12 is reset.

Specifically, as shown in (a) of FIG. 2, the IG main switch 5 is held turned off and the input terminal level of the NOT gate 9, that is, IG main switch input, is high as shown in (b) of FIG. 2. If the test terminal 13R is set to the ground level, the test mode output is at the low level as shown in (g) of FIG. 2. The transistor 11 produces the high level as an IG relay output at its collector as shown in (c) of FIG. 2.

It is very likely however that ICs mounted in a vehicle is subjected to various stresses such as vibrations generated during vehicle travel or large temperature changes. As a result, the test terminal 13R may be disconnected from a wiring pattern (land) of the circuit ground. If external noises apply to the disconnected test terminal 13R, which is in the open condition, the signal level at the terminal 13R becomes high. As a result, the output terminal of the OR gate 14 becomes high as shown in (f) of FIG. 2. This signal releases the test mode circuit 12 from the reset condition and changes the test mode output to the high level as shown in (g) of FIG. 2.

The transistor 11 then turns on and the IG relay output becomes low as shown in (c) of FIG. 2 to turn on (close) the switch 2a of the IG relay 2 from the turned off condition (open) as shown in (d) of FIG. 2. At this time, the input terminal signal level of the NOT gate 15, that is, an IG detection input, changes from low to high as shown in (e) of FIG. 2. The OR gate 14 responsively produces the low level signal as shown in (f) of FIG. 2. Thus, the test mode circuit 12 is reset so that the test mode output is changed to the low level as shown in (g) of FIG. 2.

With the test mode output being changed to the low level, the IG relay output responsively becomes high as shown in (c) of FIG. 2. The switch 2a of the IG relay 2 is turned off as shown in (d) of FIG. 2, and the IG detection input is changed to the low level as shown in (e) of FIG. 2. If the level at the test terminal 13R has returned to the low level, the control circuit 8 returns to the normal rest condition. If the test terminal 13R is still at the high level as shown by dotted lines in FIG. 2, the above sequence is repeated.

The embodiment operates as shown in FIG. 3, when the IG main switch 5 is turned on by a driver for the engine start or vehicle travel. It is assumed as the initial condition that, similarly to the above case shown in FIG. 2, the test terminal 13R is open and receives the external noises so that the output terminal of the OR gate 14 is at the high level. When the IG main switch 5 is turned on as shown in (a) of FIG. 3, the IG main switch input level changes from high to low as shown in (b) of FIG. 3. The transistor 11 turns on as shown in so that the IG relay output become high to low as shown in (c) of FIG. 3.

Thereafter, similarly to the case of FIG. 2, the switch 2a of the IG relay 2 changes from OFF to ON as shown in (d) of FIG. 3, and the IG detection level changes from low to high as shown in (e) of FIG. 3. The output terminal level of the OR gate 14 becomes low as shown in (f) of FIG. 3. Thus, the test mode circuit 12 is surely reset, the test mode output is set to the low level as shown in (g) of FIG. 3. In this case, even if the test mode output changes to the high level due to external noises, etc., the transistor 11 is held turned on. Therefore, the ECU 6 is restricted from operating erroneously.

As described above, the control circuit 8 is constructed to reset the test mode circuit 12 when the relay 2 is turned on (closed) in response to the turn-on of the IG main switch 5. Further, the control circuit 8 is constructed to turn on the relay 2 to supply the battery voltage of the battery 1 to the power line 3, when changing its operation mode to the test mode by the test mode circuit 12. This is similar to the case when the IG main switch 5 is turned on to change the voltage level of the power line 3. As a result, even if the control circuit 8 is erroneously shifted to the test mode for some reason, this test mode is released by resetting the test mode circuit 12 in connection with the turning on of the IG main switch 5. Thus, a fail-safe operation can be ensured and the reliability of the control circuit 8 can be enhanced.

The logic circuit section 16 of the test mode circuit 12 is reset by taking the OR-logic of the set level of the test terminal 13R and the voltage level of the power line 3. Therefore, even if the test terminal 13R becomes disconnected (open), the logic circuit section 16 can be reset surely by turning on the IG main switch 5, which causes the IG relay 2 to turn on and change the voltage level of the power line 3. Since the power control circuit 8 is subjected to a harsh operating condition which may cause erroneous operation in the ECU 6, the reliability of the power supply control can be enhanced.

The above embodiment may be modified in many ways. For instance, the logic circuit section 16 may be reset to a high active level. The CPU 7 may be provided only when necessary, and the input terminal of the NOT gate 9 may be connected directly to the junction between the resistor 4 and the IG main switch 5. If the input of the battery voltage as it is is not appropriate, the voltage may be converted to an appropriate level. The control circuit 8 is not limited to a vehicle-mounted ECU or a power control circuit, but may be applied to systems in which a voltage signal is supplied to a voltage signal line from an external side in response to switching conditions of an ON/OFF switch.

Further, if the control circuit 8 does not have a sufficient number of terminals available for the test terminal 13R, the test mode setting may be limited by using signals set at input terminals which are normally used. That is, the input signal which is turned on during a system operation may be used to limit the test mode.

Still further, the test mode circuit 12 need not be provided within the power control circuit but may be provided separately from the power control circuit 8.

What is claimed is:

1. A test mode circuit provided in a control circuit, which supplies a voltage signal applied from an external side to other circuit sections by turning on an ON/OFF switch provided in a voltage signal line when an external operation switch is turned on, the test mode circuit comprising:
    a logic circuit section configured to set a test mode in which the ON/OFF switch is turned on to cause the control circuit to make a shift to the test mode; and
    a reset circuit section configured to reset the logic circuit section when the ON/OFF switch is turned on in response to a turn-on of the external operation switch,
    wherein the logic circuit section is constructed to be reset by an OR logic of a set level applied to an external terminal and a level of the voltage signal line.

2. The test mode circuit according to claim 1, wherein the voltage signal applied from the external side is a battery voltage.

3. The test mode circuit according to claim 1, wherein:
    the control circuit is mounted in a vehicle; and
    the external operation switch is an ignition switch of the vehicle.

4. A reset control method for a test mode circuit provided in an electronic control unit, in which a voltage signal is applied from an external side to circuit sections therein by turning on an ON/OFF switch provided in a voltage signal line when an external operation switch is turned on, the reset control method comprising steps of:
    setting, by a logic circuit section, a test mode in which the ON/OFF switch is turned on to make a shift to a test mode; and
    resetting the logic circuit section when the ON/OFF switch is turned on in response to a turn-on of the external operation switch,
    wherein the step of resetting resets the logic circuit section by an OR logic of a set level applied to an external terminal and a level of the voltage signal line.

5. The reset control method according to claim 4, wherein:
    the electronic control unit is for controlling a vehicle; and
    the voltage signal applied from the external side is a battery voltage of the vehicle.

6. The reset control method according to claim 4, wherein:
    the electronic control unit includes a control circuit, which includes the test mode circuit therein and supplies the voltage; and
    the external operation switch is an ignition switch of a vehicle.

7. An integrated circuit comprising:
    an ON/OFF switch disposed on a voltage signal line coupling a battery to other circuit sections, the ON/OFF switch supplying a voltage signal to the other circuit sections when in an ON state;
    an ignition main switch for placing the ON/OFF switch in the ON state;
    a logic circuit section configured to generate a test mode signal upon activation;
    a transistor coupled to the logic circuit section and the ON/OFF switch, the transistor placing the ON/OFF switch in the ON state while the logic circuit section generates the test mode signal; and
    a reset circuit section configured to deactivate the logic circuit section when the ignition main switch is activated to place the ON/OFF switch in the ON state.

8. The integrated circuit of claim 7, further comprising a logical element disposed between the ignition main switch and the voltage signal line, the logical element configured to generate high and low signals of opposite polarity in accordance with the ignition main switch, wherein the transistor places the ON/OFF switch in the ON state when the logical element generates the high signal or the logic circuit section generates the test mode signal.

9. The integrated circuit of claim 7, further comprising:
    a central processing unit (CPU) connected between the ignition main switch and a resistor connected to the voltage signal line; and
    an inverter coupled to the output of the CPU and the transistor,
    wherein the CPU is configured to produce a high level signal to the inverter when the ignition main switch is off and to produce a low level signal to the inverter when the ignition main switch is on,
    wherein the transistor places the ON/OFF switch in the ON state based upon the output of the inverter or the logic circuit section generating the test mode signal.

10. The integrated circuit of claim 7, wherein the reset circuit section includes an OR gate coupled to the voltage signal line and the logic circuit section.

* * * * *